United States Patent [19]

Rathe

[11] 4,019,145
[45] Apr. 19, 1977

[54] SYNCHRO RATE GENERATOR

[75] Inventor: John C. Rathe, Cedar Rapids, Iowa

[73] Assignee: Rockwell International Corporation, El Segundo, Calif.

[22] Filed: June 24, 1976

[21] Appl. No.: 699,282

[52] U.S. Cl. .................. 328/133; 307/295; 332/23 A; 332/48; 328/132; 328/61; 329/50
[51] Int. Cl.$^2$ ...................... H03D 3/18; H03K 1/16
[58] Field of Search ................ 332/23 A, 23 R, 48; 329/50; 328/133, 61, 132; 307/295, 262, 232

[56] References Cited

UNITED STATES PATENTS

| | | | |
|---|---|---|---|
| 3,265,904 | 8/1966 | Spencer | 307/232 |
| 3,495,078 | 2/1970 | James et al. | 328/133 X |
| 3,501,651 | 3/1970 | Cottrell | 307/295 |
| 3,514,719 | 5/1970 | Rhodes | 332/23 R |
| 3,600,694 | 8/1971 | McCollum | 329/50 |
| 3,629,711 | 12/1971 | Strole | 328/133 X |
| 3,639,850 | 2/1972 | Brooks | 329/50 |

*Primary Examiner*—John S. Heyman
*Attorney, Agent, or Firm*—Richard W. Anderson; Robert J. Crawford

[57] ABSTRACT

Rate of change of the angle $\theta$ conveyed by a three-wire synchro signal is developed as an inherently normalized signal $(d\theta/dt)$ by dividing N sin $\theta$ $(d\theta/dt)$ signals by N sin $\theta$ signals and N cos $\theta$ $(d\theta/dt)$ signals by N cos $\theta$ signals over selected ones of contiguous segments of a full 360° range of $\theta$ where the divisor signals do not go through zero. The N sin $\theta$ and N cos $\theta$ signals are normalized outputs of dividers which divide synchro carrier reference demodulated sin $\theta$ and cos $\theta$ signals by a synchro carrier reference level signal. N sin $\theta$ and N cos $\theta$ signals are differentiated to derive the N sin $(d\theta/dt)$ and N cos $\theta$ $(d\theta/dt)$ signals. Logic circuitry switches appropriately signed ones of the signals as divisor and dividend inputs to an output divider whose output is $(d\theta/dt)$ and is independent of synchro carrier level, synchro transformation ratios, phase shift between the synchro X-Y-Z voltages and the synchro carrier reference, and synchro carrier reference waveform distortion.

8 Claims, 6 Drawing Figures

SYNCHRO RATE GENERATOR

This invention relates generally to electronic circuitry for deriving a signal proportional to the rate of change of a signal with respect to time. More particularly, the present invention relates to circuitry for electronically deriving a signal proportional to the rate of change of the angle defining three-wire output from a synchro or the two-wire quadrature outputs from a synchro resolver. These signal sources comprise sinusoidally amplitude modulated carrier signals of particular phase which mutally define an angle. Known means for deriving a rate signal from such three-wire or two-wire input angular information signals have employed servo motor generators in a closed loop which are caused to rotate at a speed proportional to the changing angle defined by the input. The motor drives a generator the output of which is a signal proportional to the rate of change of the angle defined by the multi-wire input signal source.

More recent means for obtaining the rate from a three-wire synchro signal have employed purely electronic means whereby, generally, the three-wire synchro signal is converted to a pair of two-wire signals respectively definitive of the sine and cosine functions of the angle defined by the synchro output. Means have then been employed to operate upon the cosine and sine functions of the angle information in accordance with certain trigonometric identities to develop an output signal which is proportional to the rate of change of the angular information conveyed by the synchro output.

For example, one method, as defined in Rhodes U.S. Pat. No. 3,514,719, converts the synchro X-Y-Z information to demodulated A sin $\theta$ and A cos $\theta$ information. A sin $\theta$ and A cos $\theta$ are differentiated to obtain signals proportional to A cos $\theta d\theta/dt$ and A sin $\theta\ d\theta/dt$ respectively. Cross multiplication of the sine and cosine signals and their respective derivatives are utilized in Rhodes to obtain an output signal defined as $A^2\ (d\theta/dt$.

This method of rate derivation is subject to error because of the constant term $A^2$ in the output. Synchro transformation ratio variations and synchro loading by other aircraft systems are known to load synchro voltages by as much as 20%. Since these variations directly affect the constant term A, this method of rate taking is subject to rate errors of 35%. Since the transformation ratios and synchro loading by other aircraft systems can load synchro voltages 20% independent of reference excitation, excitation frequency independent normalization of the output signal becomes impossible.

A further synchro output rate taking means is defined in Cottrell U.S. Pat. No. 3,501,651, wherein signals, proportional respectively to the sine and cosine functions of the angle defined by the synchro, are differentiated and selectively applied to a common output. Here again, however, the accuracy of the output signal is impaired by, or is dependent upon, the constancy of synchro trnsformation ratio and is dependent upon loading of the synchro.

A further known system, Muller U.S. Pat. No. 3,930,175, develops tangent and cotangent functions of the angular information conveyed by the synchro input and empoys linearization of these signals over defined segments of angle variation with subsequent differentiation and combination to drive output rate independent of loading. Muller employs linearization of the inherently nonlinear tangent and cotangent signals prior to differentiation to ultimtely obtain a rate signal output which approximates the rate of change of the varying input angular information conveyed by the synchro input.

Further known art by means of which the three-wire output of a synchro may be converted to a single output signal definitive of the angular information is defined in Spencer U.S. Pat. No. 3,265,904, wherein selected portions of the sine and cosine functions of the angular information angle are switched to a common output line. The method of Spencer, however, should it be employed for rate taking, would be subject to error due to synchro loading, synchro transformation ratio variations, etc.

A known prior art system recognizing the value of normalization as concerns signals emanating from the synchro input devices, is defined in McCollum U.S. Pat. No. 3,600,694. McCollum develops a signal which is proportional respectfully to the sine and cosine functions of the information angle and divides these signals to obtain an output signal proportional to the tangent of the angle, to provide an output signal which is independent of signal transformation ratio variations and synchro loading.

The object of the present invention is to provide an improved solid state rate taking means for obtaining an output signal definitive of the rate of change of the angular input information conveyed by a three-wire synchro input, and wherein the output signal is inherently normalized so as to be independent of synchro transformation ratio variations and synchro loading.

The present invention is featured in means for converting the three-wire synchro input signal to signals respectively proportional to the sine and cosine functions of the input information angle. These signals are normalized by division by a synchro carrier reference signal and then differentiated. The normalized outputs from the differentiating means are subsequently divided by the normalized sine and cosine functions to obtain an output signal which varies only as the rate of change of the information angle with respect to time and is completely indepedent of synchro transformation ratios and variations in the phase and amplitude of the synchro carrier brought about by synchro loading. Because sine and cosine functions are continuous, as opposed to tangent and cotangent functions for example, a simplified circuitry may be employed for selecting particular portions of the differentiator outputs to be divided by the sine and cosine functions to obtain the rate of definitive output. The system utilizes the sine and cosine functions per se, and is not subject to error caused by linearization techniques necessary in known systems.

These and other features and objects of the present invention will become apparent upon reading the following description, with reference to the accompanying drawing in which.

Figure 1:
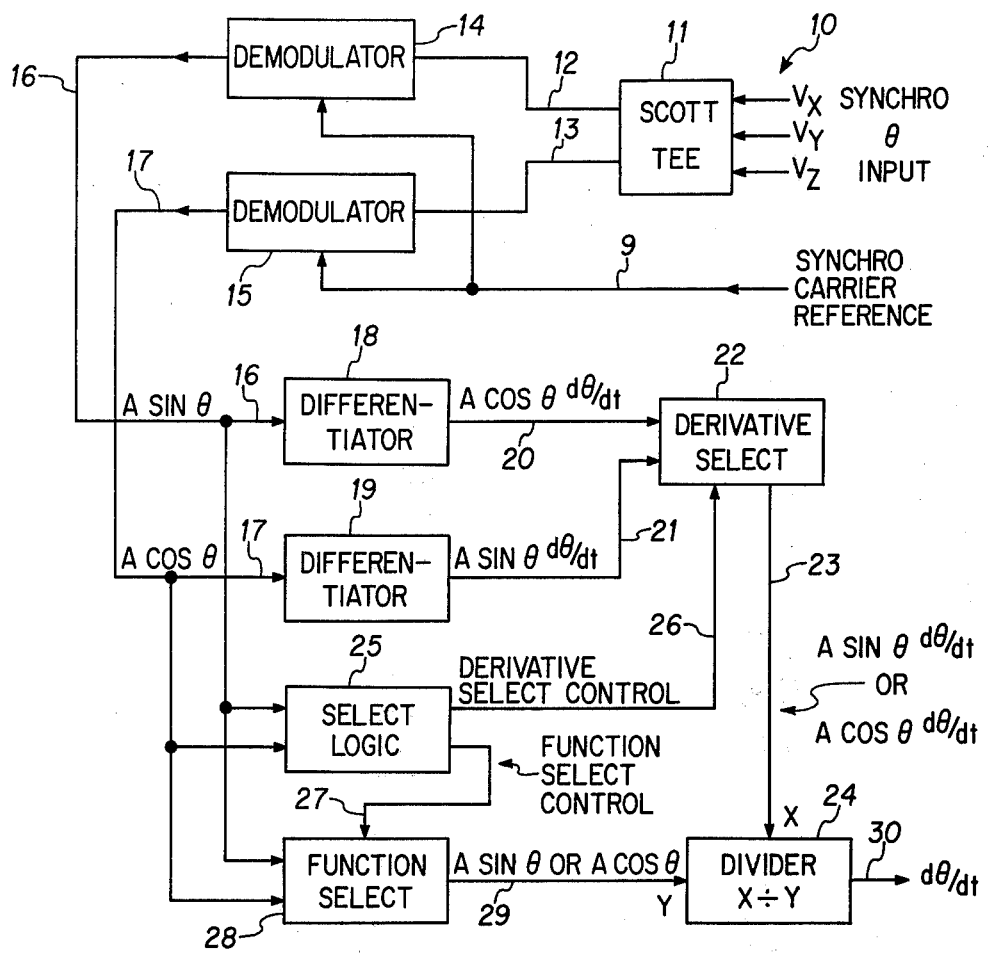
FIG. 1 is a generalized functional block diagram of the rate taking circuitry in accordance with the present invention.

As in the above-referenced Rhodes U.S. Pat. No. 3,514,719, the inherently normalized method of rate derivation to be described herein, as generally depicted in FIG. 1, converts the synchro X-Y-Z information on input lines 10 to demodulated sin $\theta$ and cos $\theta$ data information. For this purpose the three-wire synchro input 10 may be applied to a Scott Tee 11 in known fashion to develop outputs 12 and 13 respectively defined as A sin $\theta$ sin $\omega t$, and A cos $\theta$ sin $\omega t$, where $\theta$ is the information angle conveyed by the three-wire synchro input 10 and sin $\omega t$ represents the synchro carrier signal. It is understood that the synchro input signal 10 represents 120°-phased-displaced amplitude modulations of a carrier signal with the composite amplitude modulations being definitive of an angle. The sine $\theta$ definitive output 12 and the cos $\theta$ definitive output 13 from Scott Tee 11 then represent quadrature amplitude modulated carrier signals as applied to respective demodulators 14 and 15. A synchro carrier reference input 9 is applied to each of the demodulators 14 and 15 such that the outputs 16 and 17 from the demodulators represent the amplitude modulation envelopes on the respective inputs thereto, and are, accordingly, defined as A sin $\theta$ and A cos $\theta$, respectively.

The present invention operates upon the demodulator outputs 16 and 17 in a manner which does not involve multiplication of the demodulator outputs, as is employed in the above-referenced Rhodes patent, but, rather, differentiates the demodulator outputs to obtain A cos $\theta$ $(d\theta/dt)$ and A sin $\theta$ $(d\theta/dt)$ signals, and the basic method employed to derive rate $(d\theta/dt)$ involves dividing particular outputs from the differentiators by particular outputs from the demodulators, for example, A sin $\theta$ $(d\theta/dt)$ ÷ A sin $\theta$ such that the A sin $\theta$ variations cancel out, and the result of the division is a signal defined as $(d\theta/dt)$. By using this method, the rate output is independent of X-Y-Z voltages on the three-wire synchro input 10 because the constant A term is divided out. Thus the obtained rate output signal $d\theta/dt$ is also independent of phase shift between the X-Y-Z voltages 10 and the synchro reference 9, and is independent of synchro carrier reference waveform distortion.

Referring again to FIG. 1, the A sin $\theta$ and A cos $\theta$ outputs 16 and 17 from the demodulators are seen to be applied to respective differentiators 18 and 19 the outputs 20 and 21 of which are defined respectively as A cos $\theta$ $(d\theta/dt)$ and A sin $\theta$ $(d\theta/dt)$. The differentiator outputs 20 and 21 are applied to a derivative select means 22 which, as will be further described, selects one or the other of the cosine and sine inputs 20 and 21 as output 23 to a divider 24. The selected A sin $\theta$ $(d\theta/dt$ or A cos $\theta$ $(d\theta/dt)$ signal on input 23 to divider 24 comprises the dividend (numerator) of the dividing function.

The A sin $\theta$ and A cos $\theta$ 16 and 17 from the demodulators are additionally applied as inputs to a select logic block 25 and to a function select block 28. As will further be described, select logic block 25 provides control outputs 26 and 27 to the derivative select block 22 and the function select block 28. Output 26 from select logic block 25 is applied to the derivative select block 22 to effect selection of A sin $\theta$ $(d\theta/dt)$ or A cos $\theta$ $(d\theta/dt)$ on line 23 for application to divider 24. The function select block 28, under control of the function select control output 27 from select logic block 25, selects either A sin $\theta$ or A cos $\theta$ on line 29 for application to divider 24 as the divisor (denominator) input thereto. The output 30 from divider 24 comprises input X divided by input Y and is defined as $d\theta/dt$, the A sin $\theta$ and A cos $\theta$ terms inputted to the divider having been self-cancelled in the dividing operation.

It might be emphasized that the functional diagram of FIG. 1 is generalized in nature and does not take into consideration the necessary polarities (sign) of the inputs to the divider such that the rate output maintains a consistent polarity (sign) throughout operation over a full range of synchro input information angles.

Figure 2:
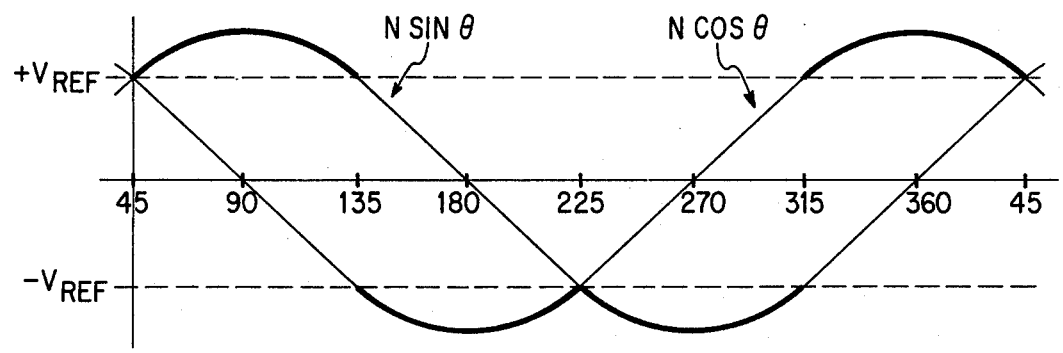
FIG. 2 is a diagrammatic representation of sine and cosine functions of an angle $\theta$ over a 360° range.

FIG. 2 represents sin $\theta$ and cos $\theta$ functions over a full 360° range. Since the system to be described herein operates on the basis of at all times dividing a signal proportional to the rate of change of one of these sine and cosine functions by the corresponding sin $\theta$ or cos $\theta$ function, per se, means are employed to assure that the derivative selected and the function selected at any particular time for division in the output divider 24 do not involve discontinuities or sign changes throughout that particular portion of the operating range during which they are effective in developing the rate output. Obviously, the sin $\theta$ or cos $\theta$ function selected by the function selector block 28 of FIG. 1 cannot be zero, since dividing by zero would give rise to a discontinuity in the rate output. Further, neither of the inputs X or Y to the output divider 24 should be applied to divider 24 when the information angle $\theta$ value gives rise to sine and cosine functions of undesirably low values. FIG. 2 illustrates in heavy line an exampled selection of portions of the sin $\theta$ and cos $\theta$ signals which may be logically selected as the Y input 29 to divider 24. FIG. 2 represents those portions of the sin $\theta$ and cos $\theta$ signals which are in excess of respective positive and negative reference levels, wherein the sin $\theta$ signal and cos $\theta$ signal selected is always greater than 0.707 of maximum. It is noted in FIG. 2 that none of the exampled selected segments of the sin $\theta$ and cos $\theta$ signal goes through zero, and that each selected segment is taken through the maximum amplitude range of one of the sin $\theta$ and cos $\theta$ functions. FIG. 2 additionally graphically depicts the reversal of sign of each of the sin $\theta$ and cos $\theta$ functions over the 360° range, and means will be described whereby this particular change in sign is considered in maintaining a consistency of sign of the output rate signal 30 from the divider 24. Briefly, means will be described by means of which the inverse of the derivative signal of each of the sin $\theta$ and cos $\theta$ functions is applied as the X input to the divider 24 when the information angle $\theta$ defines a sin $\theta$ or cos $\theta$ function of negative polarity, thus establishing a constant polarity (sign) in the output rate signal $d\theta/dt$. It might also be noted at this point that the particular segments of the sin $\theta$ and cos $\theta$ functions established by the positive and negative voltage references of FIG. 2 is not essential to operation of the circuitry to be defined, it being necessary only that the selective segment of the respective sin $\theta$ and cos $\theta$ signals be contiguous throughout the 360° range, that no one of the selected segments goes through zero, and, preferably, that no one of the selected segments include a small amplitude value of the function from which it is defined.

In general summary, the rate taking circuitry of the present invention operates to derive rate from dividing $A \sin \theta \, (d\theta/dt)$ by $A \sin \theta$ $$\left( \frac{A \sin \theta \frac{d\theta}{dt}}{A \sin \theta} = \frac{d\theta}{dt} \right),$$

or to divide $A \cos \theta \, d\theta/dt$ by $A \cos \theta$ $$\left( \frac{A \cos \theta \frac{d\theta}{dt}}{A \cos \theta} = \frac{d\theta}{dt} \right).$$

The two signals so divided are selected over segments of the operating range for particular synchro angles $\theta$ through which the particular sine or cosine functions do not go through zero and preferably exhibit magnitudes over the greater magnitude portions of their respecive functions. It will be seen, then, that the system herein described exhibits no discontinuities, involves no approximations based on linearization techniques, and inherently normalizes the output.

Figure 3:
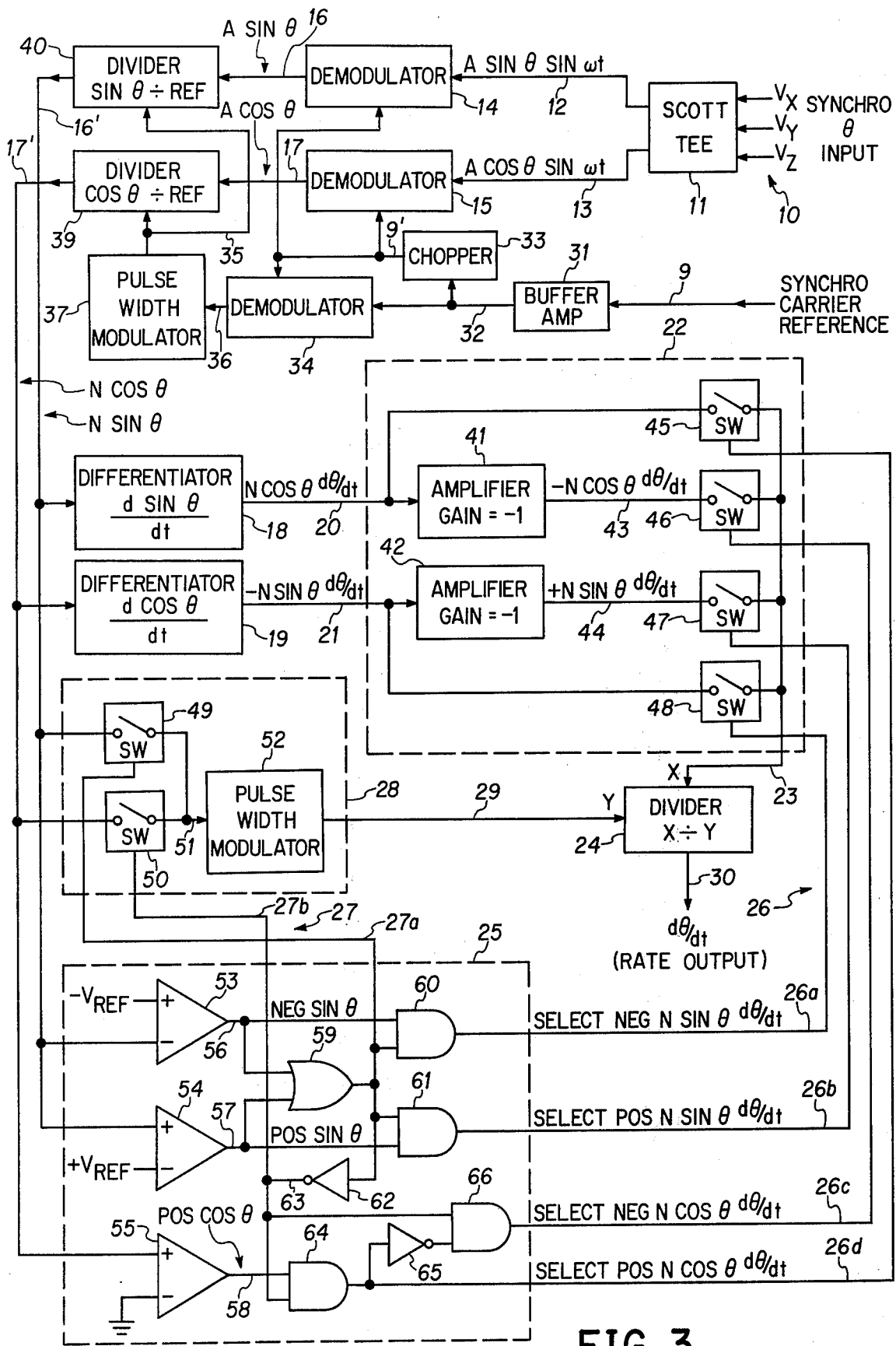
FIG. 3 is a detailed functional block diagram of an embodiment of the rate taking circuitry in accordance with the present invention.

A detailed function diagram of a particular embodiment of the present invention is shown in FIG. 3. The synchro input signals 10 are applied to a Scott Tee 11 which outputs quadrature amplitude-modulated carrier signals 12 and 13 defined respectively as $A \sin \theta \sin \omega t$ and $A \cos \theta \sin \omega t$. Outputs 12 and 13 are applied to respective demodulators 14 and 15 where they are demodulated against a synchro carrier reference derived signal so as to remove the synchro carrier from the inputs 12 and 13 and develop respective outputs 16 and 17 in the form of dc voltages representing synchro shaft angle, defined respectively as $A \sin \theta$ and $A \cos \theta$. The reference input to demodulators 14 and 15 is derived from a synchro carrier reference input 9 which may be applied to a buffer amplifier 31 with the output 32 thereof applied to a chopper 33. Chopper 33 generates a square wave signal output 9' at the synchro carrier frequency which is in phase with the synchro carrier frequency. The output from chopper 33 is applied as reference input to each of demodulators 14 and 15. Outputs 16 and 17 from demodulators 14 and 15 are applied as respective first inputs to dividers 40 and 39. Output 9' from chopper 33 and the output 32 from buffer amplifier 31 are applied as respective inputs to a further demodulator 34 which outputs a signal 37 comprising a dc voltage proportional to the synchro carrier reference amplitude. The dc synchro carrier amplitude reference signal 36 is applied to a pulse width modulator 37 the output 35 of which comprises a pulse train with duty cycle proportional to the synchro carrier reference amplitude. Dividers 40 and 39 thus divide the respective input signals $A \sin \theta$ and $A \cos \theta$ by the synchro carrier reference amplitude conveyed by output 35 of pulse width modulator 37 to create synchro reference normalized outputs 16' and 27' respectively defined as $N \sin \theta$ and $N \cos \theta$. Synchro reference power input amplitude variations do not create fluctuations in these $N \sin \theta$ and $N \cos \theta$ signals. The divider outputs 16' and 17' are applied as respective inputs to differentiators 18 and 19 which develop respective outputs 20 and 21 defined as $N \cos \theta \, (d\theta/dt)$ and $-N \sin \theta \, (d\theta/dt)$. The $N \sin \theta$ and $N \cos \theta$ inputs to the differentiators 18 and 19 must be a function of synchro angle only, so that any change of voltage with respect to time $(dv/dt)$ input to the differentiator circuits 18 and 19 is an indication of synchro shaft rotation only. It is for this purpose that the outputs from demodulators 16 and 17 are synchro reference normalized in dividers 40 and 39 prior to application to the differentiators 18 and 19.

The derivative select means 22, generally depicted in FIG. 1, is embodied in the system of FIG. 3 as including inverting amplifiers 41 and 42 to which the respective outputs from the differentiators are applied, with the outputs 20 and 21 of the differentiators being applied to respective switch means 45 and 48 and the outputs from the inverting amplifiers 41 and 42 being applied to respective switch means 46 and 47. Respective ones of the switches 45–48, when closed, apply the output from differentiator 18 to common output line 23, the output from inverting amplifier 41 to line 23, the output from inverting amplifier 42 to line 23, and the output from differentiator 19 to line 23. The derivative function switched onto line 23 comprises the X input (the dividend input) to the output divider 24.

The normal sine and cosine definitive outputs 16' and 17' are additionally applied through respective switches 49 and 50 as input 51 to a pulse width modulator 52. The output 29 from pulse width modulator 52 comprises a pulse train with duty cycle proportional to the input signal and thus proportional to either $N \sin \theta$ or $N \cos \theta$. The output 29 from pulse width modulator 52 comprises the Y input (the divisor input) to the output divider 24.

The selection of the function $N \sin \theta$ or $N \cos \theta$ as Y input to the divider 24, along with the selection of the appropriately signed derivative function applied as the X input to divider 24, is controlled by logic circuitry which operates the respective switches 49 and 50 in the function select logic block 28 and the respective switches 45–48 in the derivative select logic block 22. The function select logic 25 depicted in te generalized system of FIG. 1 is embodied in FIG. 3 as signal comparators and logic gates which collectively respond to the $N \sin \theta$ and $N \cos \theta$ signals 16' and 17' to provide appropriate logic outputs on lines 27 to the function select switches 49 and 50, and on the output lines 26 to the derivative select switches 45–48 to provide the appropriately signed X inputs to output divider 24 as well as a selected one of the function inputs as Y input to the output divider 24. The select logic 25 in FIG. 3 is embodied as comparators 53 and 54 which, in general, determine when the amplitude of the $N \sin \theta$ term is large enough to be used as the divisor in the subsequent rate derivation, as well as determining the sign of the $N \sin \theta$ function. A further comparator 55 receives the N cosine function 17' to determine the sign of the $N \cos \theta$ function.

Comparator 53 determines when the $N \sin \theta$ function applied to the inverting input terminal thereof exceeds a negative voltage reference $(-V_{ref.})$. Comparator 54 receives the $N \sin \theta$ input 16' and determines when this function exceeds a predetermined positive reference $(+V_{ref.})$. Outputs 56 and 57 from comparators 53 and 54 are applied as inputs to an OR gate 59 the output 27a of which is applied to switch 49 in the function select logic block 28 to close switch 49 and apply the $N \sin \theta$ function signal on line 16' as Y defining input to the output divider 24. The output 27a from OR gate 59 is additionally applied, along with the output 56 from comparator 53, as input to an AND gate 60 the output 26a of which is applied to switch 48 in the derivative select logic block 22 to select $-N \sin \theta \, (d\theta/dt)$ as the X input to output divider 24. The output 27a from OR gate 59, along with the output 57 from comparator 54, are applied as respective inputs to a further AND gate 61 the output 26b of which is applied to switch 47 in derivative select logic of block 22 to apply +N sin $\theta$ ($d\theta/dt$) as the X input to the output divider 24. The output from OR gate 59 is inverted by inverter 62 to develop a signal on line 63 which is applied as input 27b to switch 50 in the function select logic block 28 to effect selection of N cos $\theta$ as Y defining input to output divider 24. The output 63 from inverter 62 is additionally applied along with the output 58 from comparator 55 as input to AND gate 64 the output 26d of which is applied to switch 45 in the derivative select logic block 22 to apply +N cos $\theta$ ($d\theta/dt$) as the X input to the output divider 24. Output 26d from AND gate 64 is applied through an inverter 65 along with the output 63 from inverter 62 as respective inputs to AND gate 66 the output 26c of which is connected to switch 46 in the derivative select logic block 22 to apply −N cos $\theta$ ($d\theta/dt$) as the X input to output divider 24.

Figure 4:
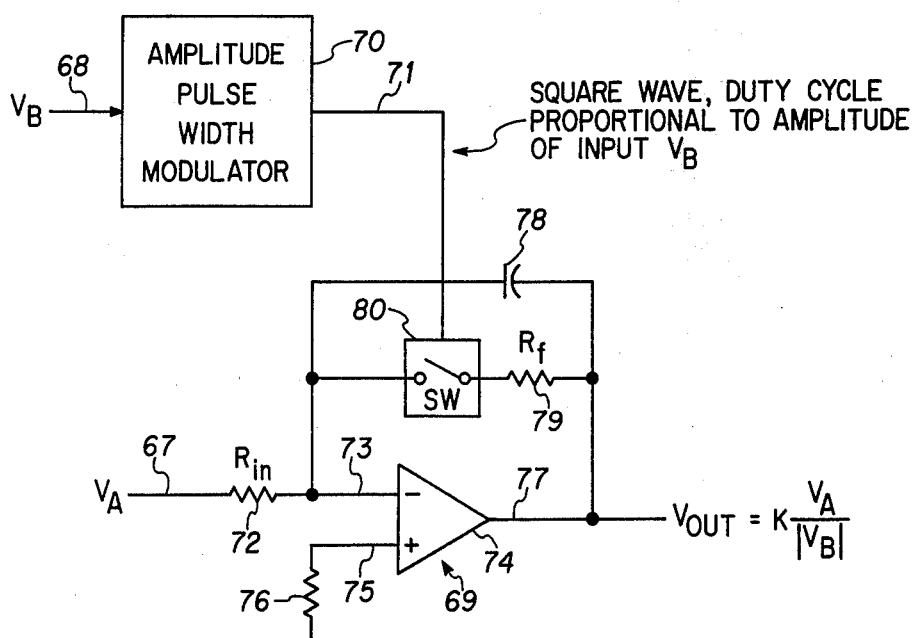
FIG. 4 is a schematic block diagram of a signal divider implementation as may be employed in the present invention.

The divider circuitries 40, 39 and 24 in the embodiment of FIG. 3 may be implemented using the circuitry shown in FIG. 4. Each divider comprises an inverting operational amplifier gain stage 69 with an analog switch in series with the feedback resistor. Referring to FIG. 4, high gain amplifier 74 receives an input signal $V_A$ on line 67 through input resistor 72 to the inverting input terminal 73. The noninverting input terminal 75 is returned through ground through a resistor 76. The output 77 from the high gain amplifier 74 comprises the output from the divider and is additionally tied back through feedback resistor 79 and switch 80 to the input terminal 73 as well as through a capacitor 78. The switch 80 is controlled by a square wave which has a duty cycle (DC) proportional to a voltage amplitude $|V_B|$ on line 68 which is fed through an amplitude pulse width modulator 70. In this configuration, the feedback resistance 79 is effectively equal to RF/DC. Therefore, the feedback resistance is proportional to $1/|V_B|$. Using the equation for the gain of an inverting operational amplifier $V_{out} = V_{in}(R_f/R_{in})$, it can be seen that:

$$V_{out} = K \frac{V_A}{|V_B|}.$$

where $K$ is a constant and is a function of $R_f$ and $R_{in}$. The output 77 of the divider of FIG. 4 comprises a d-c signal defined as a constant times input 67 divided by input 68.

Since the particular dividers implemented into the embodiment of FIG. 3 operate on a square wave duty cycle proportional input basis, each is used in conjunction with a pulse width modulator whereby the divisor input $V_B$ is converted to a square wave duty cycle proportional signal. Pulse width modulator 37 provides the variable duty cycle waveform to dividers 40 and 39 and pulse width modulator 52 provides the variable pulse width duty cycle input to output divider 24. The pulse width modulators employed in the system of FIG. 3 may comprise various ones of known functional elements which generate a square wave output with a duty cycle which is a function of the amplitude of d-c input voltage. One such available functional element useful for this purpose might comprise a commercially available Signetics NE/SE 555 linear integrated circuit.

The function selecting and derivative selecting switches depicted in the embodiment of FIG. 3 may comprise electronic switches responsive to particular logic level inputs to complete a path for the input signals applied thereto.

The circuitry of FIG. 3 thus described is seen to develop normalized signals proportional to N sin $\theta$ and N cos $\theta$, as well as normalized signals proportional to N cos $\theta$ ($d\theta/dt$) and N sin $\theta$ ($d\theta/dt$) and the respective derivative complements. The manner in which the select logic circuitry 25 of FIG. 3 applies appropriate X and Y inputs to output divider 24 to develop rate output $d\theta/dt$ may best be comprehended with reference to the function waveforms depicted in FIG. 2 along with the logic operational waveforms depicted in FIG. 5. FIG. 2 illustrates the N cos $\theta$ and N sin $\theta$ signals throughout a full 360° operating range. The $+V_{ref.}$ and $-V_{ref.}$ levels depicted in FIG. 2 represent one exampled reference corresponding to 0.707 $V_{max}$ where $V_{max}$ is the maximum value of the normalized functions N sin $\theta$ and N cos $\theta$. The heavy-line portions of the respective functions in FIG. 2 represent contiguous segments of the functions which it is desired to switch as Y inputs to the output divider 24. Thus between 45° and 135° values of $\theta$, the N sin $\theta$ function is selected; between 135° and 225° values of $\theta$, the N cos $\theta$ function is selected; between 225° and 315° values of $\theta$, the N sin $\theta$ function is selected; and between 315° and 45° values of $\theta$, the N cos $\theta$ function is selected. When the N sin $\theta$ function exceeds either the positive or negative reference voltage level depicted in FIG. 2, the N sin $\theta$ function is selected as the Y input to the output divider.

As will be further described, the select logic circuitry implemented in FIG. 3 basically effects selection of N sin $\theta$ as Y input to the output divider 24 when this function exceeds the chosen reference, and, when the sin $\theta$ function does not excceed the reference, the cos $\theta$ function is selected. This particular generalized statement of function is emphasized, since it is not necessary for proper operation of the rate deriver of this invention that the reference be chosen as 0.707 $V_{max}$ as depicted in FIG. 2. Further discussion will bear out that the voltage reference may be selected over a considerable range as some value within the amplitude excursion of the N sin $\theta$ function which does not give rise to unduely small amplitudes of either sin $\theta$ or cos $\theta$ over the resulting selected segments thereof. Generally, the selection of too high a reference as concerns the sin $\theta$ function will give rise to selection of cos $\theta$ segments having unduely small values over a portion of the range. Conversely, selection of too low a sin $\theta$ reference will give rise to unduely low sin $\theta$ values for this selected segment over portions of the range. From an operational standpont it is desirable to avoid either of these circumstances, and thus the reference is preferably chosen to be at a level corresponding somewhat to the mean value of the amplitude excursions of the N sin $\theta$ and N cos $\theta$ signals. A particular fixed value of the reference is uniquely unnecessary for proper operation of the rate deriving circuitry of the invention. It will become apparent that the reference might actually vary over a considerable range without in any way impairing the operation of the circuitry.

Figure 5:
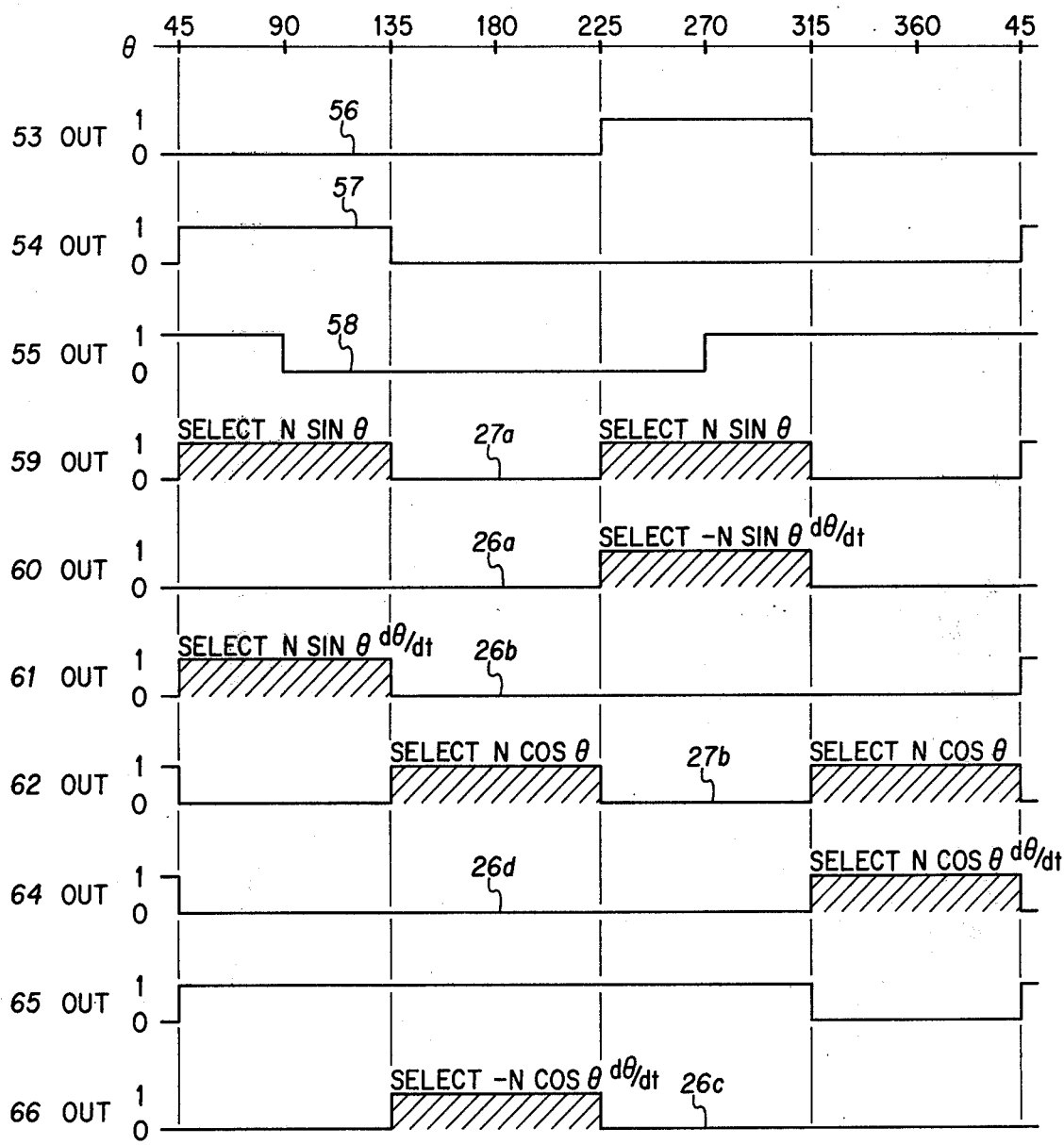
FIG. 5 depicts operational waveforms of the logic circuitry of FIG. 3.

Referring to the logic waveforms of FIG. 5 as related to N sin $\theta$ and N cos $\theta$ functions of FIG. 2, the output from comparator 53 is at a logic-one level for values of $\theta$ between 225° and 315°, where the N sin $\theta$ function exceeds the $-V_{ref.}$ level. The output from comparator 54 is a logic one level for values of $\theta$ between 45° and 135°, where the N sin $\theta$ exceeds $+V_{ref}$. The output from comparator 55 is at a logic one level for values of $\theta$ between 270° and 90°, that is, over that portion of the N cos $\theta$ function when N cos $\theta$ is positive. The output from OR gate 59 is at a logic one level when N sin $\theta$ exceeds either $+V_{ref}$ or $-V_{ref}$, and it is this waveform 27a which is applied to switch 49 in the function select block 28 to select N sin $\theta$ as the function input Y to the output divider 24. The output from AND gte 60 is at a logic one level for $\theta$ values between 225° and 350°, corresponding to that portion of the selected N sin $\theta$ function which is negative in sign. The output 26a from AND gate 60 is applied to switch 48 in the derivative select block 22 to connect $-N \sin \theta (d\theta/dt)$ as X input to the output divider 24.

The output from AND gate 61 is a logic one level for values of $\theta$ between 45° and 135°, corresponding to that portion of the N sine $\theta$ function which exceeds $+V_{ref}$ and this output 26b is applied to switch 47 in the derivative select logic block 22 to thereby connect $+N \sin \theta (d\theta/dt)$ as X input to the output divider. Here it is noted that the selection of the plus derivative function is consistent, signwise, with the selection of the $+N \sin \theta$ function. The output from inverter 62 is a logic one level when the output from OR gate 59 is a logic zero, and this output 27b is applied to switch 50 in the function select block 28 to connect N cos $\theta$ as Y input to the output divider 24.

The output from AND gate 64 is at logic one level only for values of $\theta$ between 315° and 45°. This output 26d is applied to switch 45 in the derivative select logic block 22 to connect $+N \cos \theta \, d\theta/dt$ as X input to the output divider. The output of inverter 65 is the inverse of that of the output of AND gate 64 and the output from AND gate 66 is at a logic one level only for values of $\theta$ between 135° and 225°. This output 26c is applied to switch 46 in the derivative select logic block 22 to connect $-N \cos \theta (d\theta/dt)$ as X input to the output divider 24.

Now, with general reference to the logic selecting waveforms of FIG. 5, it is seen that when N sin $\theta$ is selected and is positive, the derivative term selected is $+N \sin \theta (d\theta/dt)$. When the selected N sin $\theta$ segment is negative, the selected derivative function is likewise negative. Similarly, when the selected N cos $\theta$ function is negative, the selected derivative is negative, and when the selected N cos $\theta$ segment is positive, the derivative is positive. Thus, the proper sign of the $d\theta/dt$ output 17 of the embodiment of FIG. 3 is maintained throughout the full operating range.

The exampled waveforms of FIG. 5 are those resulting from a selection of comparator reference voltages corresponding to 0.707 of the maximum value of the N sin $\theta$ and N cos $\theta$ functions. It is seen that selection of $V_{ref}$ as 0.707 $V_{max}$ results in selection of quandrants of the N sin $\theta$ and N cos $\theta$ signals as Y inputs to the output divider, and that these selected quadrants exhibit amplitude ranges of the respective functions in excess of 0.707 $V_{max}$. As above mentioned, it is not necessary that the reference be chosen as 0.707 $V_{max}$, nor is it necessary that the comparator reference actually remain at a stabilized value. The logic circuitry embodied in FIG. 3 selects the predetermined N sin $\theta$ segments, and dictates that the N cos $\theta$ segments be automatically inputted to the divider for the remainder of the full operational range.

Figure 6:
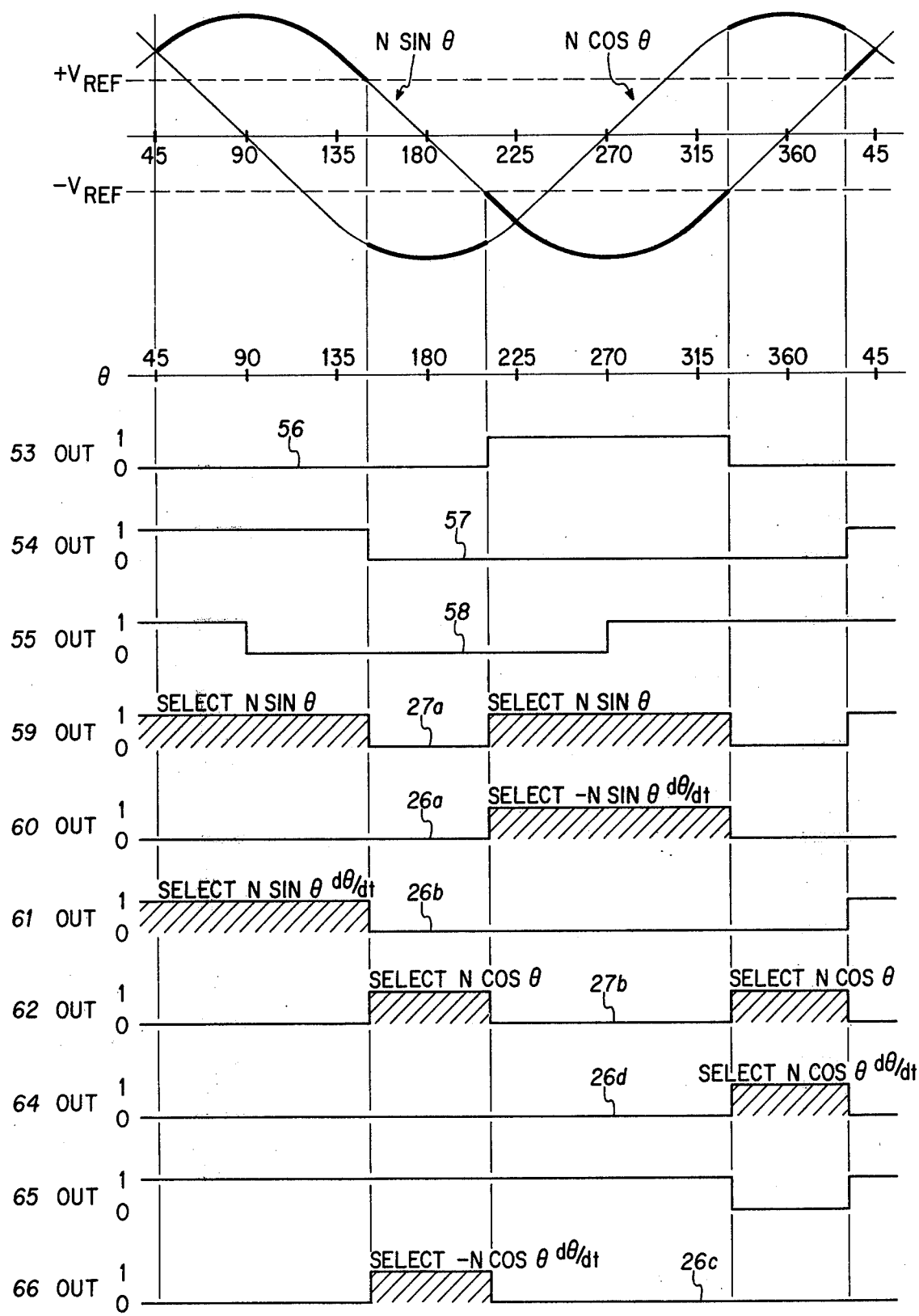
FIG. 6 depicts further operational waveforms of the logic circuitry of FIG. 3.

For example, and with reference to FIG. 6, the N sin $\theta$ voltage comparator reference inputs are depicted as being selected as 0.5 $V_{max}$. The resulting select logic waveforms are depicted in FIG. 6 and, as emphasized in heavy line on the N sin $\theta$ and N cos $\theta$ functions, correspondingly greater length segments of the N sin $\theta$ function are inputted as Y inputs to the output divider, while correspondingly lesser length segments of the N cos $\theta$ function are inputted. Again, the logic operates to determine via comparators 53 and 54 when the N sin $\theta$ function exceeds the reference, in this case, 0.5 $V_{max}$. The logic then defines that the sine $\theta$ function be switched as Y input into the output divider. For the remainder of the operating range, the N cos $\theta$ function is automatically switched as Y input to the divider. As in the previously described example, the value of N sin $\theta$ and N cos $\theta$, as switched to the output, is maintained at a value at least as great as the reference value applied to comparators 53 and 54. Thus, the reference may be chosen throughout an appreciable portion of the voltage excursion range of the N sin $\theta$ input to the comparators without impairing the operation of the circuitry, within the limitations that the switched segment is never zero and, from the standpoint of reliable operation in the output divider, that the amplitudes of the switch segments be maintained at reliable oerational voltage levels. It is to be emphasized again that there is no absolute critical fixed relationship between the selected voltage reference applied to comparators 53 and 54 and the particular amplitudes of the normalized sine $\theta$ and cosine $\theta$ functions applied to the comparitors, thus the voltage reference applied to comparators 53 and 54 may emanate from an independent voltage source.

The rate deriving circuitry of the present invention uniquely operates to normalize sin $\theta$ and cos $\theta$ functions of the input information angle $\theta$ carried by the three-wire synchro input, derives $d\theta/dt$ indicative signals by differentiating respective N sin $\theta$ and N cos $\theta$ functions which are completely independent of reference excitation (normalized), and subsequently derives a $d\theta/dt$ output signal which is a function only of the rate of change of the input parameter $\theta$, that is, is independent of absolute X-Y-Z synchro voltage because the constant term is divided out, and also independent of phase shift between the X-Y-Z voltages and the synchro reference carrier as well as independent of synchro carrier reference waveform distortion. Although this invention has been described with respect to a particular embodiment thereof, it is not to be so limited, as changes might be made therein which fall within the scope of the invention as defined in the appended claims.

What is claimed is:

1. Means for developing a signal proportional to the rate of change of angular information conveyed by respective quadrature sinusoidally amplitude modulated carrier signals comprising; means for demodulating each of said quadrature signals and said carrier signal against said carrier signal as reference, means for dividing each of said demodulated quadrature signals by a carrier signal amplitude reference as obtained from demodulating said carrier reference signal, means for differentiating each of the output signals from said means for dividing, and means for selectively dividing selected outputs from said means for differentiating by selected ones of the outputs of said means for dividing as a function of the angular information conveyed by said quadrature amplitude modulated carrier signals, the output from said means for selectively dividing comprising an output signal proportional to said rate of change of angular information.

2. The signal development means of claim 1, with said means for selectively dividing comprising a signal divider having a dividend input and a divisor input, signal amplitude comparitor logic means receiving the respective outputs of said means for dividing as inputs thereto and including switching logic means responsive to the output of said comparator logic means to apply a switched one of the outputs from said means for dividing as input to he divisor input of said signal divider, and a switched one of the outputs of said means for differentiating as input to the dividend input of said signal divider, with the output from said signal divider comprising said angular rate definitive output signal.

3. The signal development means of claim 2, with means for inverting the respective outputs of said means for differentiating, said switching logic means being responsive to the output of said comparator logic means to apply switched ones of the outputs of said means for differentiating and output complements from said means for inverting as input to the dividend input of said signal divider.

4. The signal development means of claim 3, with said quadrature angle-defining signals being proportional respectively to sin $\theta$ and cos $\theta$, where $\theta$ is the information angle, said comparator logic means comprising a first signal comparator receiving the sin $\theta$ proportional output signal from said means for dividing and producing an ouput signal when said sin $\theta$ signal exceeds a predetermined negative signal amplitude, a second signal comparator receiving said sin $\theta$ proportional output signal and producing an output signal when said sin $\theta$ signal exceeds a like predetermined positive signal amplitude, and third signal comparator receiving the cos $\theta$ proportional output signal from said means for dividing and producing an output signal when said cos $\theta$ signal is of positive polarity, and logic gating means receiving the outputs of said first, second and third signal comparators to develop a first pair of logic outputs to respective switching means through which one of the sin $\theta$ and cos $\theta$ signals is applied as divisor input to said signal divider and respective third, fourth, fifth, and sixth logic outputs to respective switching means through which one of the outputs and output complements of said means for differentiating is applied as dividend input to said signal divider.

5. The signal development means of claim 4 with the respective switched ones of said divisor and dividend inputs to said signal dividing being those like ones of said sin $\theta$ and cos $\theta$ definitive signals as respectively outputted from said means for dividing and inverting and said means for differentiating.

6. The signal development means of claim 5, with said logic switching means being responsive to information angles $\theta$ whose sine functions exceed a predetermined reference level to switch the sin $\theta$ definitive output of said means for dividing and the sin $\theta$ definitive output from one of said means for differentiating and inverting as respective divisor and dividend inputs to said signal divider, and being responsive to information angles whose sine functions are less than said predetermined reference value to switch the cos $\theta$ definitive output of one of said means for differentiating and inverting as respective divisor and dividend inputs to said signal divider.

7. The signal development means of claim 6, wherein said one of the sin $\theta$ and cos $\theta$ definitive outputs comprises that outputted from one of said means for differentiating and inverting having a polarity like that of the selected output from said means for dividing as applied as divisor input to said signal divider.

8. The signal development means of claim 7 wherein said predetermined reference level is substantially a mid-value of the maximum amplitude of said sin $\theta$ definitive signal.

* * * * *

UNITED STATES PATENT OFFICE
CERTIFICATE OF CORRECTION

PATENT NO. : 4,019,145
DATED : April 19, 1977
INVENTOR(S) : John C. Rathe

It is certified that error appears in the above-identified patent and that said Letters Patent are hereby corrected as shown below:

IN THE SPECIFICATION

Column 1, line 41, delete "$A^2(d\theta/dt$" and substitute therefor --$A^2(d\theta/dt)$--.
Column 1, line 60, delete "trnsformation" and substitute therefor --transformation--.
Column 1, line 65, delete "empoys" and substitute therefor --employs--.
Column 2, line 2, delete "ultimtely" and substitute therefor --ultimately--.
Column 3, line 63, between θ and 16, insert the word --outputs--.
Column 5, line 49, delete "37" and substitute --36--.
Column 5, line 59, delete "27´" and substitute --17´--.
Column 6, line 21, delete "normal" and substitute therefor --normalized--.
Column 6, line 37, delete "te" and substitute therefor --the--.
Column 8, line 37, delete "excceed" and substitute therefor --exceed--.
Column 9, line 10, delete "gte" and substitute therefor --gate--.
Column 10, lines 26 and 27, delete "oerational" and substitute therefor --operational--.

IN THE CLAIMS

Column 11, line 13, delete "he" and substitute therefor --the--.

Signed and Sealed this twelfth Day of July 1977

[SEAL]

Attest:

RUTH C. MASON
Attesting Officer

C. MARSHALL DANN
Commissioner of Patents and Trademark